United States Patent [19]
Matsumoto et al.

[11] Patent Number: 6,046,480
[45] Date of Patent: Apr. 4, 2000

[54] PROTECTION CIRCUIT FOR SEMICONDUCTOR DEVICES

[75] Inventors: Kazuhiro Matsumoto; Kazuhiko Okawa, both of Suwa, Japan

[73] Assignee: Seiko Epson Corporation, Tokyo, Japan

[21] Appl. No.: 08/996,204

[22] Filed: Dec. 22, 1997

[30] Foreign Application Priority Data

Dec. 27, 1996 [JP] Japan .................................. 8-350195
Dec. 18, 1997 [JP] Japan .................................. 9-364446

[51] Int. Cl.[7] .............................. H01L 23/62; H01L 29/00
[52] U.S. Cl. ........................... 257/355; 257/360; 257/546
[58] Field of Search .................................. 257/355–363, 257/371, 546, 547

[56] References Cited

U.S. PATENT DOCUMENTS 5,945,713  8/1999  Voldman ................................. 257/355

FOREIGN PATENT DOCUMENTS 2-277265  11/1990  Japan .
5-275624  10/1993  Japan .

Primary Examiner—Steven H. Loke
Assistant Examiner—Ori Nadav
Attorney, Agent, or Firm—Oliff & Berridge, PLC

[57] ABSTRACT

An object is to realize a protection circuit for protecting a semiconductor device from an ESD or other surge, said protection circuit having its improved reliability with a reduced scale of circuit. An n-type diffusion region (second diffusion region) is formed on a p-type well. A diode D1 formed by the n-type diffusion region and p-type well is connected to the gate electrode of n-type transistor. Thus, the potential difference between a channel region and the gate electrode is reduced to protect the gate oxide film. The n-type diffusion region is formed in the region of the gate electrode on the side of a source region between the source region and a p-type diffusion region (second diffusion region). The layout is determined such that a bipolar formed by the drain region, p-type well and n-type diffusion region will not be turned on. A single contact of minimum size is formed in the n-type diffusion region. When it is desired to form a silicide film, it may not overlap a device isolation film. The present invention may be applied to an output buffer, input buffer, input/output buffer, interface circuit between circuits operable in different power-supply systems or the like.

11 Claims, 16 Drawing Sheets

COMPARATIVE EXAMPLES

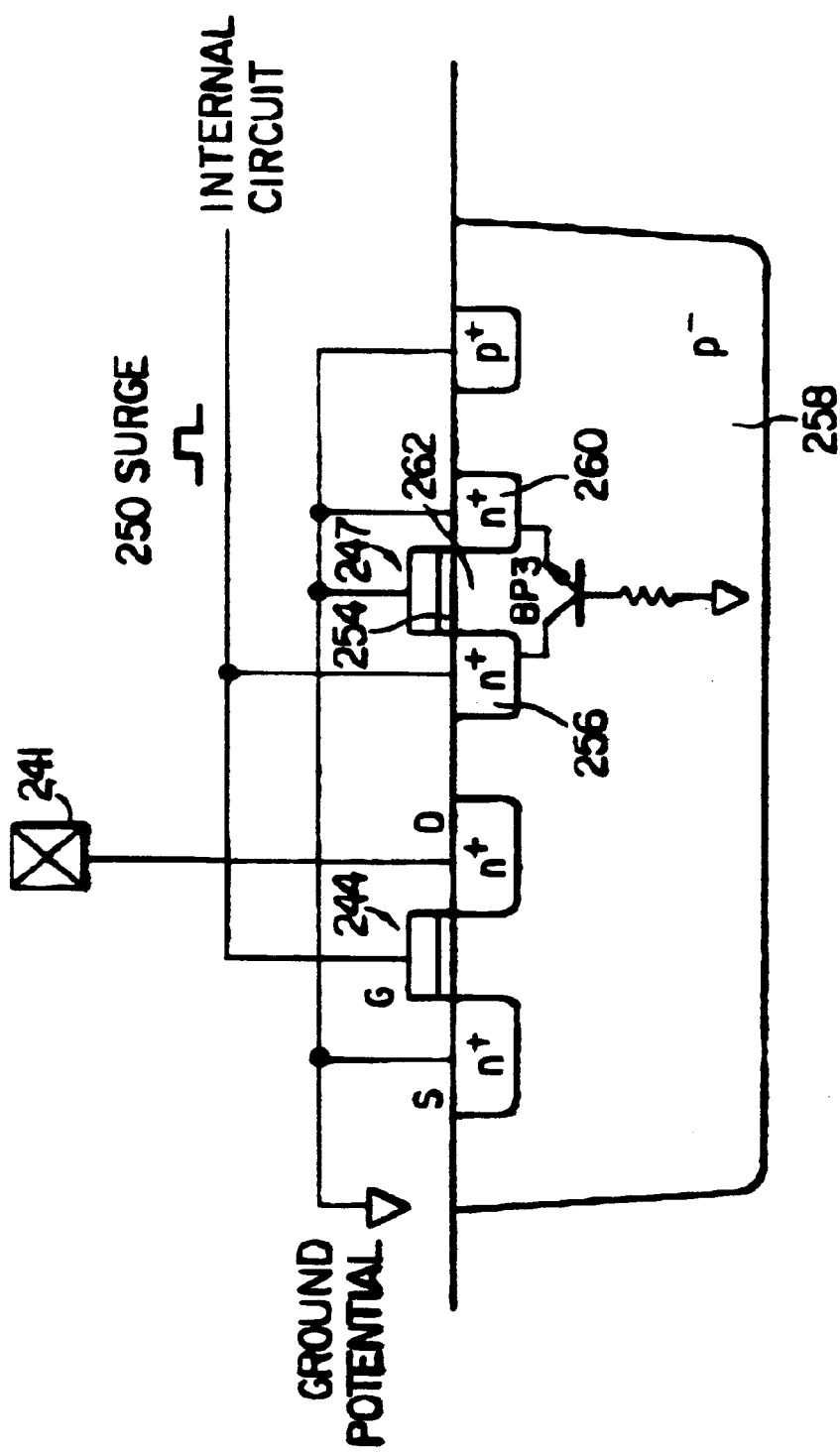

FIG.12A
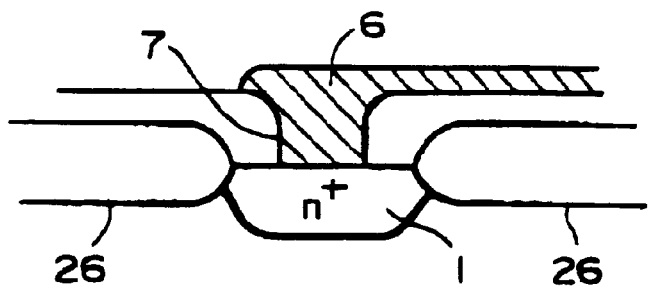
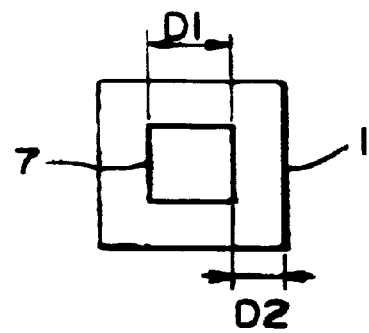
FIG.12B
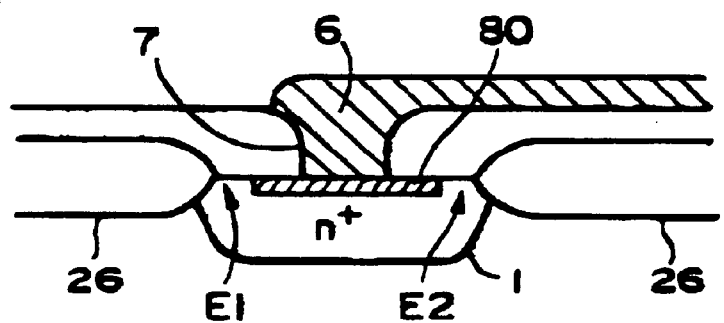
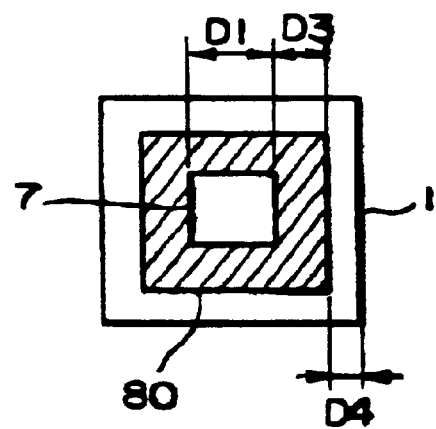

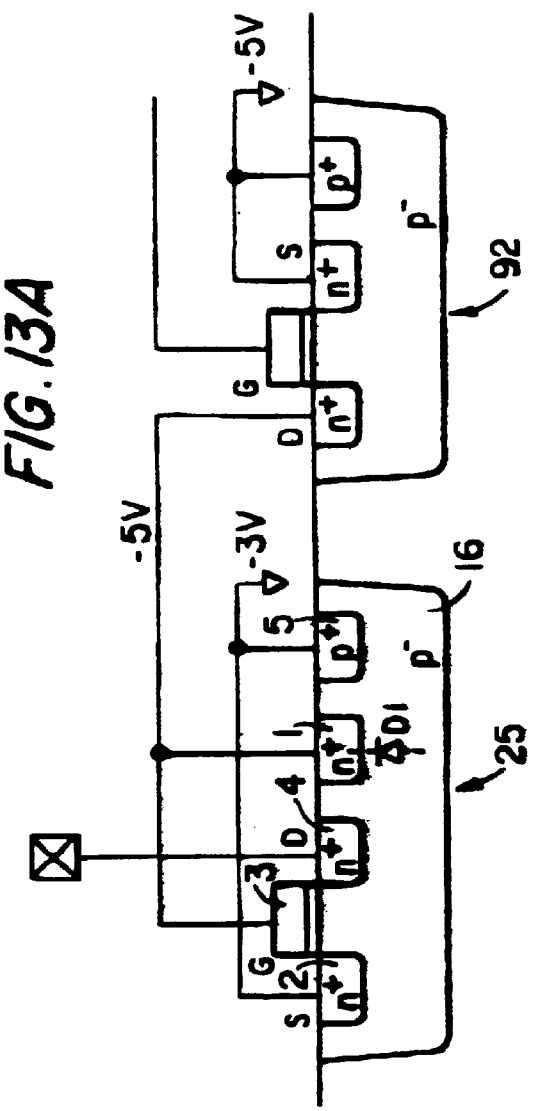
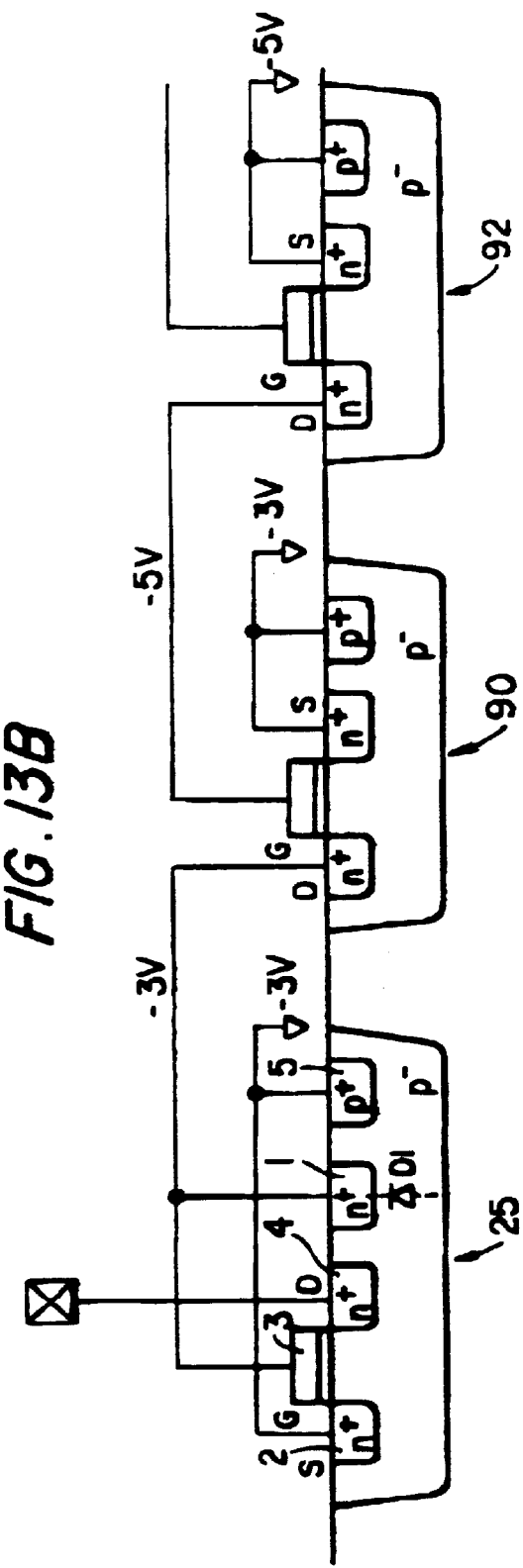

50 OUTPUT BUFFER

110 INPUT BUFFER

PROTECTION CIRCUIT FOR SEMICONDUCTOR DEVICES

BACKGROUND OF THE INVENTION

1. Field of the Invention

The present invention relates to a protection circuit for protecting a semiconductor device from electrostatic discharge (ESD) and other surges.

2. Description of the Prior Art

FIG. 1A shows a first example of a protection circuit according to the prior art. In the first example, the drain regions of transistors 203 and 204 forming an output buffer 202 are connected directly to a pad 201. The gate electrodes of the transistor 203 and 204 are connected directly to internal circuits 205 and 206.

If an electrostatic or other surge is applied to the pad 201, the first example of the prior art raises a problem. Electrostatic discharged damage or variations of characteristics may occur in the gate insulation films of the transistors 203, 204 having drain regions which initiate an avalanche breakdown.

Second and third examples of the prior art for overcoming such a problem in the first prior art example are disclosed in Japanese Patent Application Laid-Open Nos. 5-275624 and 2-277265.

As shown in FIG. 1B, the second prior art example includes a transistor 215 connected in series to a pad 211 and also in parallel to an output buffer 212. The transistor 215 has its gate electrode connected to a normally turned-on transistor 216. In the second prior art example, the output buffer 212 and the like are protected by provision of the transistor 215. The normally turned-on transistor 216 is connected to the gate electrode of the transistor 215, so as to prevent the gate insulating film of the transistor 215 from being electrostatically ruptured.

As shown in FIG. 1C, the third example of the prior art includes transistors 224 and 225 connected in series to a pad 221 and also in parallel to an input buffer 222. The gate electrodes of the transistors 224 and 225 are connected to resistors 226 and 227, respectively. The input buffer 222 and the like are protected by provision of the transistors 224 and 225. The resistors 225 and 227 are connected to the gate electrodes of the transistors 224 and 225, so as to prevent the gate insulating films of the transistors 225 and 225 from being electrostatically broken down.

However, the second prior art example of FIG. 1B requires further transistors 215, 216, in addition to the output buffer 212. This increases the area of the protection circuit occupied by these components, resulting in increase of the chip area.

Furthermore, in FIG. 1B, the transistor 216 with a resistance component is connected to the gate electrode of the transistor 215. If the potential rapidly changes in the pad 211, the potential in the gate electrode of the transistor 215 cannot follow such a change of potential. As a result, the gate insulating film of the transistor 215 would be electrostatically ruptured. In the third prior art example of FIG. 1C, the resistors 226 and 227 are respectively connected to the gate electrodes of the transistors 224 and 225. Such a feature raises another problem when the potential in the pad 221 changes rapidly. That is, it would take some time for the potential in the gate electrodes to follow such a change of potential.

SUMMARY OF THE INVENTION

An object of the present invention is geared towards overcoming the above problems and providing a protection circuit for fully protecting a semiconductor device with a reduced scale of circuit.

To this end, the present invention provides a semiconductor device protection circuit comprising a second-conductive type transistor being formed in a first-conductive type first region and having a gate electrode, a drain region and a source region to which a supply potential is applied;

a first-conductive type first diffusion region at least partially overlapping the first-conductive type first region and to which the supply potential is applied; and a second-conductive type second diffusion region being formed in the first-conductive type first region and being a non-element of a transistor, wherein the gate electrode of the second-conductive type transistor being electrically connected to the second diffusion region.

According to the present invention, the gate electrode of a transistor having a drain region which initiates an avalanche breakdown due to a violet electrostatic discharge (ESD) or other surge is connected to the second diffusion region which is of the same conductive type as that of the drain region and exists in the first region. Thus, any change of potential in the first region (channel region) due to an avalanche breakdown in the drain region would be transmitted to the gate electrode through a diode which consists of a first region and a second diffusion region. The potential difference between the gate electrode and the channel region is instantaneously alleviated to avoid the breakdown of and the variations of characteristics of the gate insulating film. As a result, the transistor having a drain region which initiates an avalanche breakdown can increase the resistance against the electrostatic discharge (ESD) and other surges.

The present invention is characterized by that the second diffusion region is on the side of the source region with respect to the gate electrode and between the source region and the first diffusion region opposite to the source region.

By forming the second diffusion region in such a region, it is possible to utilize an unfilled space effectively and to provide an efficient layout. Furthermore, the second diffusion region can be located separately from the drain region so that a bipolar formed by the drain region, first region and second diffusion region stays off.

The present invention is also characterized by that it further comprises a second contact formed at an extended portion of the gate electrode extending toward the first diffusion region; a metal conductor connected to the gate electrode through the second contact; and a first contact connected between the metal conductor and the second diffusion region. Thus, an unused space created in a region adjacent to the second contact can be used effectively to provide an efficient layout.

The present invention is further characterized by that the distance L1 between a drain contact formed in the drain region and a source contact formed on the source region is shorter than the distance L2 between the drain contact and a first contact formed in the second diffusion region.

The present invention is further characterized by that a resistance R1 of a parasitic resistor between a drain contact formed in the drain region and a source contact formed in the source region is lower than a resistance R2 of a parasitic resistor between the drain contact and a first contact formed in the second diffusion region. Thus, a bipolar formed by the drain region, first region and second diffusion region are not turned on. This prevents the second diffusion region from forming any current path. As a result, the second diffusion region can be as small as possible as long as its size allows the connection with the gate electrode.

The present invention is further characterized by that the drain region, the source region, the first diffusion region and the second diffusion region are laid out so that a first bipolar formed by the drain region, the first region and the source region is turned on and a second bipolar formed by the drain region, the first region and the second diffusion region remains off when protecting the semiconductor device. The technique of providing such a layout in which the first bipolar is turned on while the second bipolar stays off is not limited to the aforementioned technique that uses L2 larger than L1 and R2 larger than R1. Alternative techniques may include formation of the first diffusion region near the second diffusion region.

The present invention is further characterized by that a single first contact of minimum size for electrically connecting the gate electrode to the second diffusion region is formed in the second diffusion region. Thus, a minimum area is used for electrically connecting the gate electrode to the second diffusion region. As a result, the protection circuit can be made smaller in size, resulting in reduction of the chip area. It is desirable that the layout is designed so as to prevent the second diffusion region from forming a high current path.

The present invention is further characterized by that a silicide film is formed in the second diffusion region without overlapping a device isolation film surrounding the second diffusion region and that a first contact for electrically connecting the gate electrode to the silicide film is formed on the silicide film. This can realize an ohmic connection through the first contact and effectively avoid the breakdown of semiconductor device due to an ESD or other surge.

The present invention is further characterized by that a supply potential of a signal applied to the gate electrode and second diffusion region and the supply potential applied to the first diffusion region is set to potentials which prevent a diode formed by the second diffusion region and first region from turning on. This can prevent effectively a leak current created by turn-on of a diode that is formed by the second diffusion region and the first region.

In this case, it is desirable that the supply potential of the signal applied to the gate electrode and second diffusion region is equal to the supply potential applied to the first diffusion region.

The present invention is further characterized by that at least one of the output, input and input/output buffers connected to the pad is protected. This can provide the output, input and input/output buffers which have higher resistance against an ESD or other surge and a reduced layout area. Thus, the chip area can be reduced while improving the reliability.

The present invention is further characterized by that an interface circuit between a first circuit block operable in a first power-supply system and a second circuit block operable in a second power-supply system different from the first power-supply system is protected. This can avoid the breakdown of the circuitry in the second circuit block by a surge from the first power-supply system or the rupture of the circuitry in the first circuit block by a surge from the second power-supply system.

BRIEF DESCRIPTION OF THE DRAWINGS

FIG. 8 illustrates the device structure of a comparative example.

FIGS. 12A and 12B illustrate the dimensions in the n-type diffusion region, contact formed in the n-type diffusion region and others.

FIGS. 13A and 13B illustrate improved circuits usable when the supply potential of a signal applied to the gate electrode is different from that of a p-type well.

DESCRIPTION OF THE PREFERRED EMBODIMENTS

Various preferred embodiments of the present invention will now be described. It is assumed that the first and second conductive types are p-type and n-type, respectively, and a transistor used herein is of MOS type. However, the present invention may be applied to the first and second conductive types which are n-type and p-type, respectively. Furthermore, the MOS type transistor may be replaced by any of various other transistors such as MIS type transistor or the like.

1. Structure of Present Embodiment

Figure 2A:
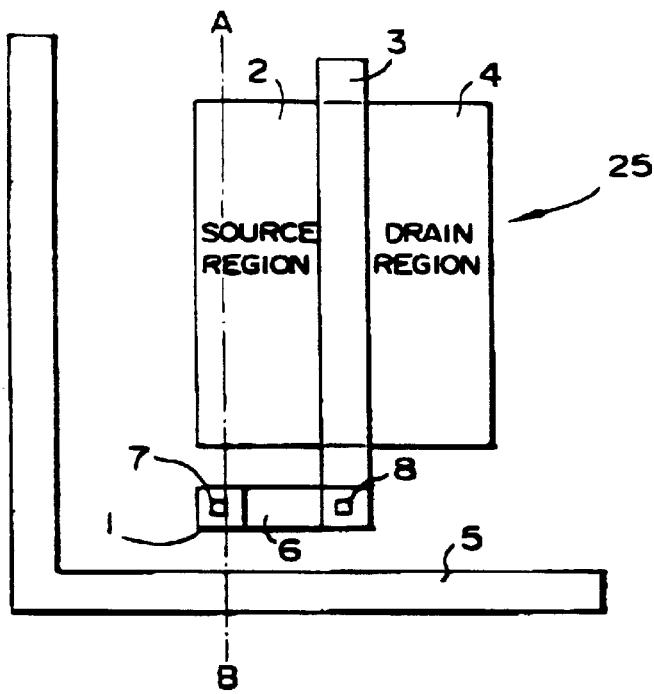
FIG. 2A is a plan view of one embodiment of a protection circuit constructed according to the present invention.
Figure 2B:
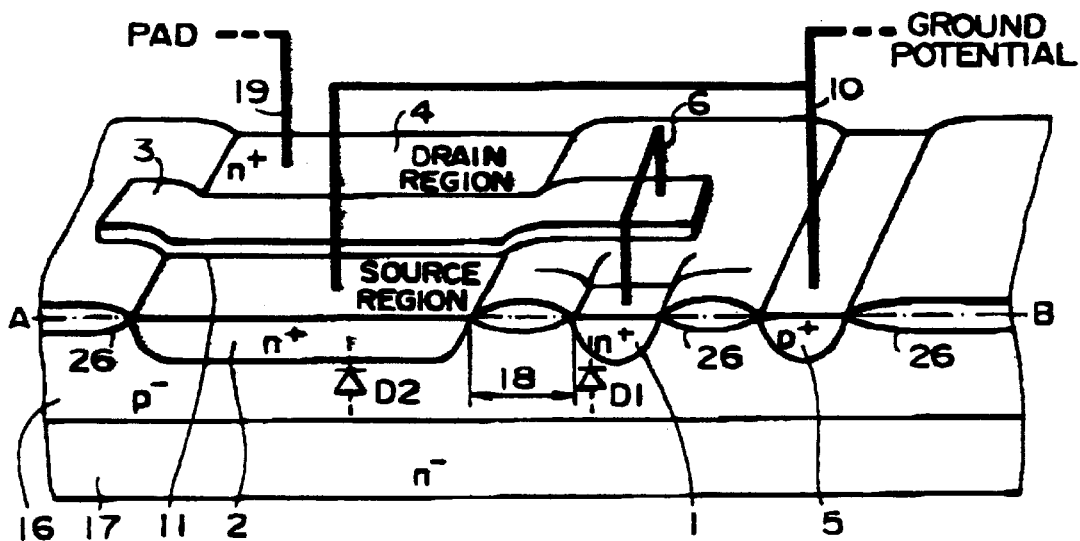
FIG. 2B is a sectional schematic representation of the protection circuit taken along a line A–B in FIG. 2A.

FIG. 2A is a plan view of a protection circuit according to the present embodiment while FIG. 2B is a sectional schematic representation of the protection circuit of FIG. 2A, taken along a line A–B.

Referring now to FIGS. 2A and 2B, an n-type transistor 25 is formed in a semiconductor substrate 17 on its p-type well 16 (first region). The transistor 25 has a source region 2, a gate electrode 3 made of polysilicon or the like and a drain region 4. The source region 2 is connected to the ground potential (grounded line) while the drain region 3 is connected to a pad (not shown).

A p-type diffusion region 5 (first diffusion region) is formed in the p-type well 16 using any appropriate manufacturing process such as diffusion and ion implantation. The p-type diffusion region 5 provides a potential to the p-type well 16. The ground potential is also applied to the p-type well 16, since the ground potential is applied to the p-type diffusion region 5. The p-type diffusion region 5 may be formed so that at least a part thereof overlaps the p-type well 16.

An n-type diffusion region 1 (second diffusion region) is formed in the p-type well 16 using any appropriate process such as diffusion and ion implantation. The n-type diffusion region 1 and the p-type well 16 form a diode D1. In the present embodiment, the n-type diffusion region 1 is not a element of the transistor.

The present embodiment is characterized by that the gate electrode 3 of the transistor 25 is electrically connected to the n-type diffusion region 1. Thus, the present embodiment can provide a protection circuit for fully protecting the semiconductor device and reduces the size of the circuit.

In FIGS. 2A and 2B, the gate electrode 3 is connected to the n-type diffusion region 1 through a metal conductor 6 made of metals such as aluminum, copper, titanium, tungsten and contacts 7, 8. The structure of electrically connecting the gate electrode 3 to the n-type diffusion region 1 is not limited to the above structure, but may take other forms such as connecting the gate electrode 3 directly to the n-type diffusion region 1 (through-hole contact).

2. Operation of Present Embodiment

The operation of the present embodiment will be described below.

Figure 3:
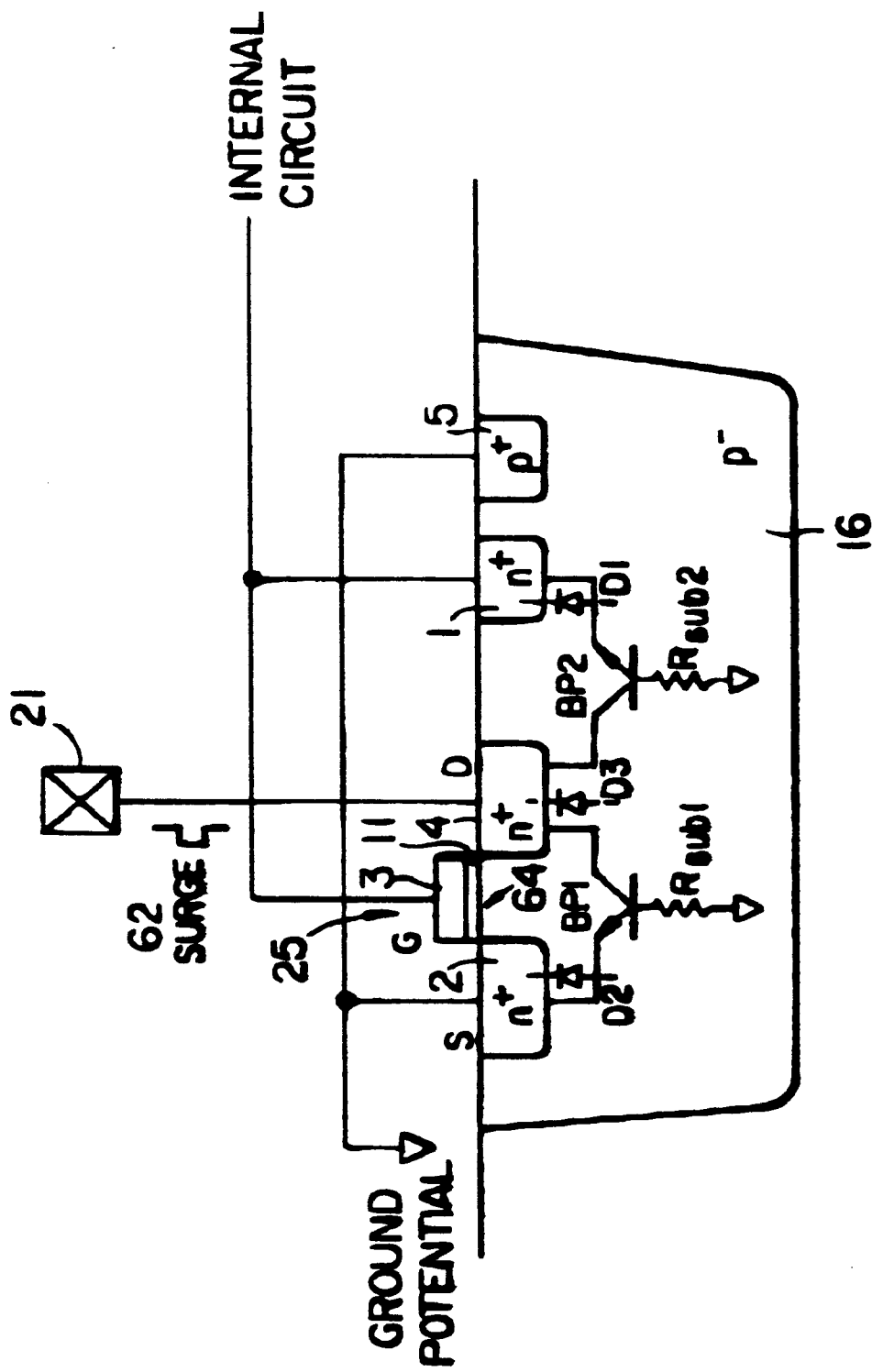
FIG. 3 illustrates the device structure of the protection circuit according to the present embodiment.

As shown in FIG. 3, a diode D3 formed by the drain region 4 and the p-type well 16 initiates an avalanche breakdown, when an ESD or other surge 62 is applied thereto from a pad 21. This places a channel region 64 below the gate electrode 3 in its high-voltage state. At this point, the potential in the p-type well 16 increases. When the difference between the potential in the p-type well 16 surrounding the source region 2 and the ground potential becomes larger than the forward voltage (e.g., 0.6 V) in a diode D2 formed by the source region 2 and the p-type well 16, the diode D2 is turned on. Both diodes D3 and D2 are turned on to form a current path through an npn type bipolar BP1 that is formed by the drain region 4, p-type well 16 and source region 2. Charges injected from the ESD or other surge 62 will be discharged to the ground potential through the current path in the npn type bipolar BP1.

On the other hand, when the diode D3 is turned on and the channel region 64 is placed in its high-potential state as described above, the potential of the p-type well 16 increases the diode D1 formed by the n-type diffusion region 1 and the p-type well 16 is turned on as in the diode D2. When the diode D1 is turned on, the gate electrode 3 will receive the potential of the p-type well 16 (more exactly, a potential induced by subtracting the forward voltage of the diode D1 from the potential of the p-type well 16 surrounding the n-type diffusion region 1). Thus, the potential difference between the gate electrode 3 and the channel region 64 is reduced to protect a gate insulating film 11 made of oxide or the like.

In this case, it is important that the respective components of the protection circuit are laid out so that the bipolar BP1 formed by the drain region 4, p-type well 16 and source region 2 are turned on, while a bipolar BP2 defined by the drain 4, p-type well 16 and n-type diffusion region 1 are not turned on. Thus, it is possible to prevent a high current from flowing into the n-type diffusion region 1 through the current path at the bipolar BP2.

The present embodiment has been described as to external application of an ESD or other surge to the drain region in the n-type transistor. Nevertheless, the present invention may be similarly applied to such a case when the ESD or other surge is externally applied to a drain region in a p-type transistor. In such a case, charges injected by the ESD or other surge is discharged to the high voltage supply line.

3. Equivalent Circuits in Present Embodiment

Figure 4A:
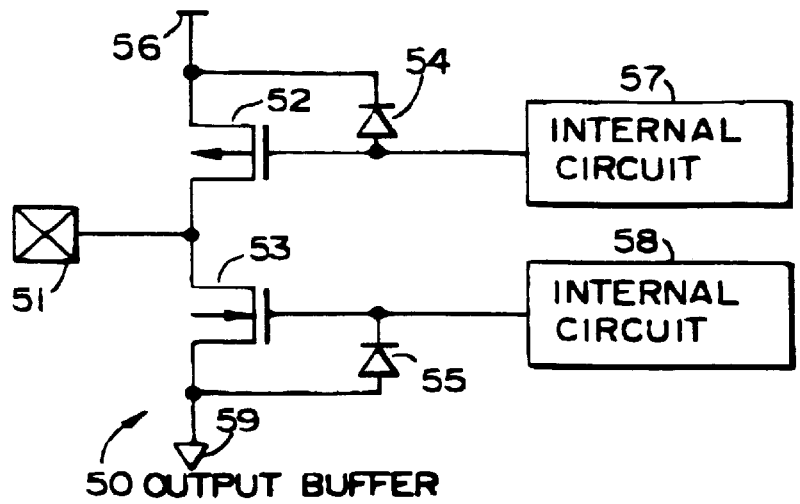
FIGS. 4A, 4B and 4C illustrate equivalent circuits usable in the protection circuit of the present embodiment.

FIG. 4A shows an equivalent circuit according to the present embodiment in which a pad (output pad) 51 is connected to the drain regions of p- and n-type transistors 52, 53 which form an output buffer 50. The source region of the p-type transistor 52 is connected to a topside supply potential 56, while the gate electrode thereof is connected to the anode of a diode 54 and an internal circuit 57, respectively. The source region of the n-type transistor 53 is connected to a ground potential (grounded line) 59, while the gate electrode thereof is connected to the cathode of a diode 55 and an internal circuit 58, respectively.

When an ESD or other external surge is applied to the pad 51, the drain region of the p-type transistor 52 or n-type transistor 53 causes an avalanche breakdown. The potential in the channel region of the transistor which initiated the avalanche breakdown then increases to a high-voltage state. Thus, the diode formed by the source region and well of the transistor which caused the avalanche breakdown is turned on. This forms a current path through a bipolar formed by the drain region, p-type well (channel region) and source region. Such a current path protects the internal circuit 57 or 58 from the ESD or other external surge.

On the other hand, the diode 54 or 55 transmits the potential of the well increased by the avalanche breakdown to the gate electrode. Thus, the potential difference between the channel region of the transistor which initiated the avalanche breakdown and the gate electrode decreases instantaneously to protect the gate insulation films in that transistor.

Figure 4B:
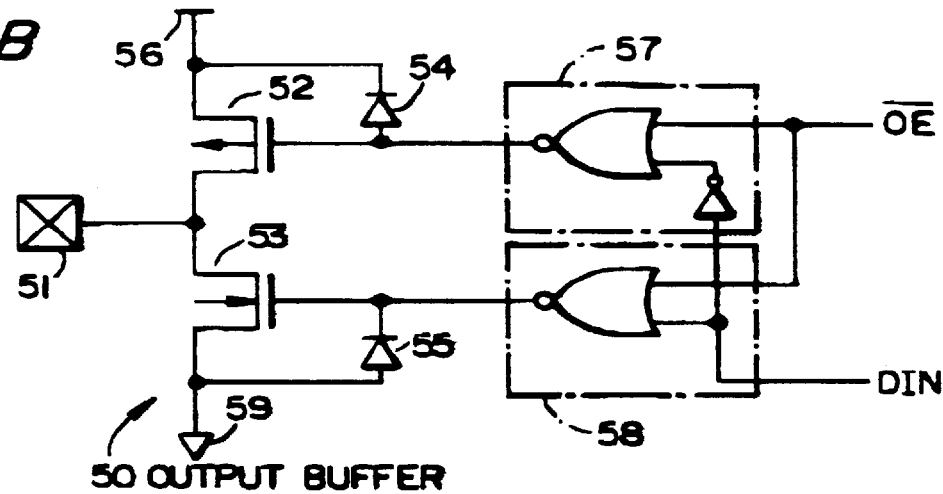
Figure 4C:
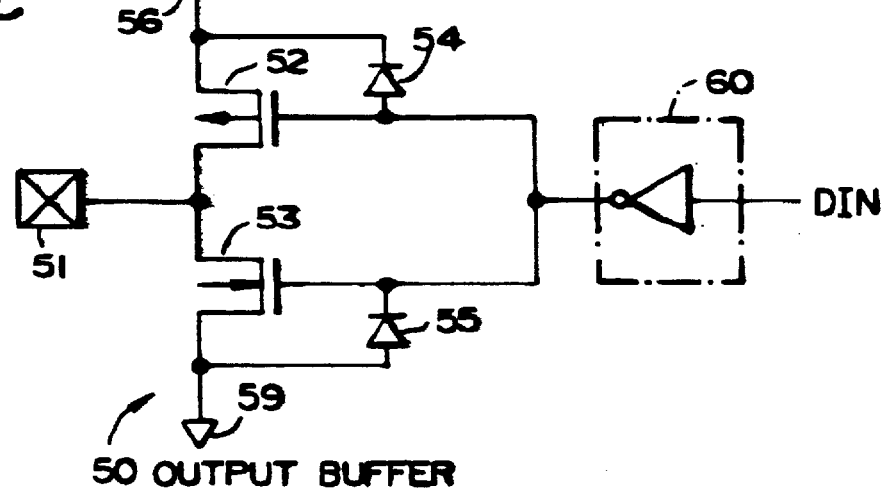

FIG. 4B illustrates the examples of the internal circuits 57 and 58. Although the present embodiment has been described as to the separate internal circuits 57 and 58, a single internal circuit 60 may be connected to the gate electrodes of the p- and n-type transistors 52, 53, for example, as shown in FIG. 4C.

4. Effects of Present Embodiment

Figure 1A:
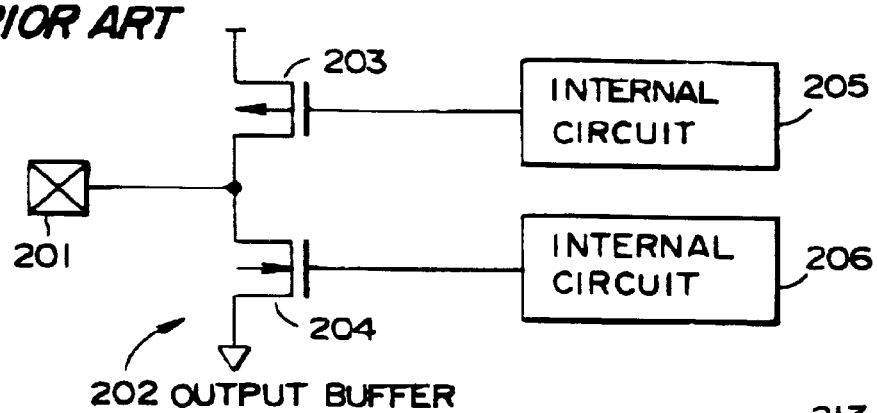
FIGS. 1A, 1B and 1C illustrate various examples of a protection circuit according to the prior art.
Figure 1B:
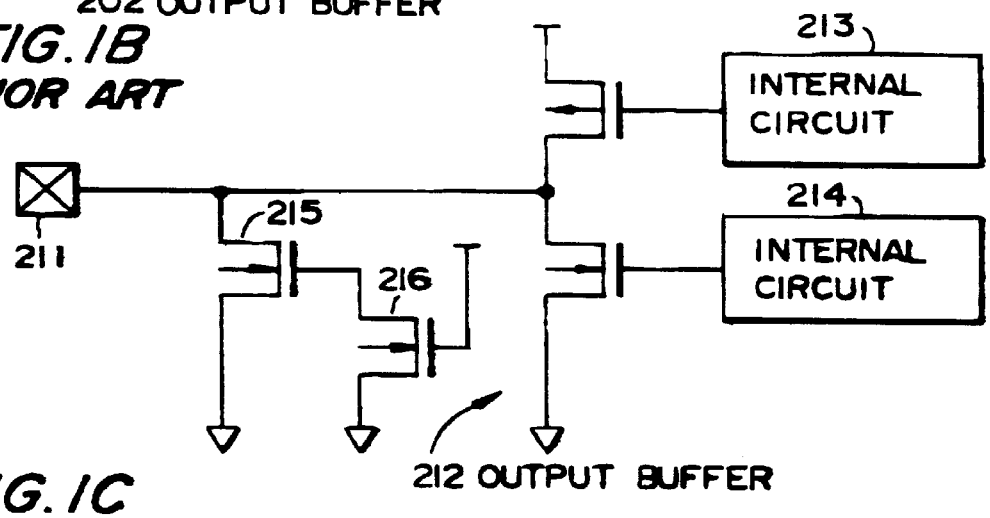
Figure 1C:
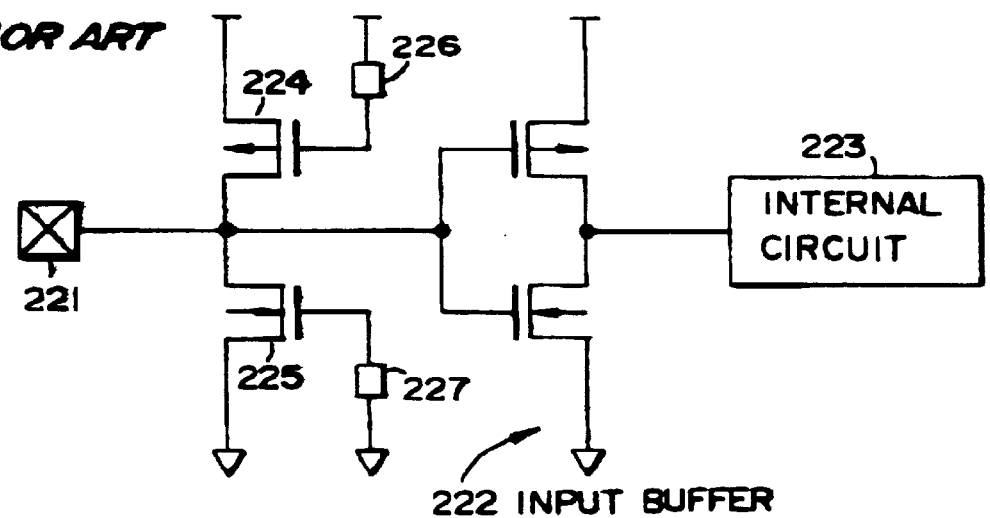
Figure 5:
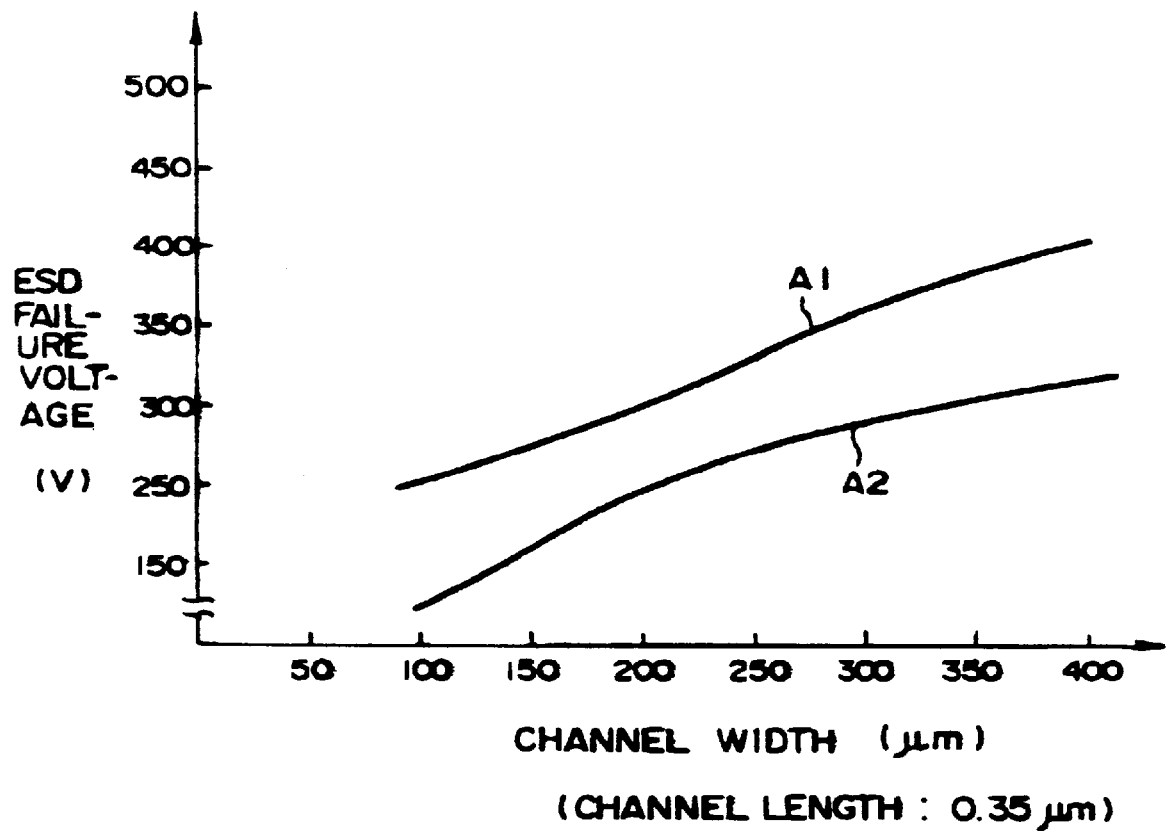
FIG. 5 is a graph illustrating an estimated result for ESD voltage endurance.

FIG. 5 shows an estimated result for ESD failure voltage using a machine model. More particularly, FIG. 5 shows an estimated result for ESD failure voltage in various transistor channel widths (and channel length equal to 0.35 $\mu$m). In FIG. 5, A1 depicts the estimated result in the present embodiment, while A2 depicts the arrangement of FIG. 1A according to the prior art. As will be apparent from comparison between A1 and A2, the present embodiment can highly improve the ESD performance in comparison with the prior art of FIG. 1A.

Such an improvement of ESD performance is brought by the following reasons.

Figure 6:
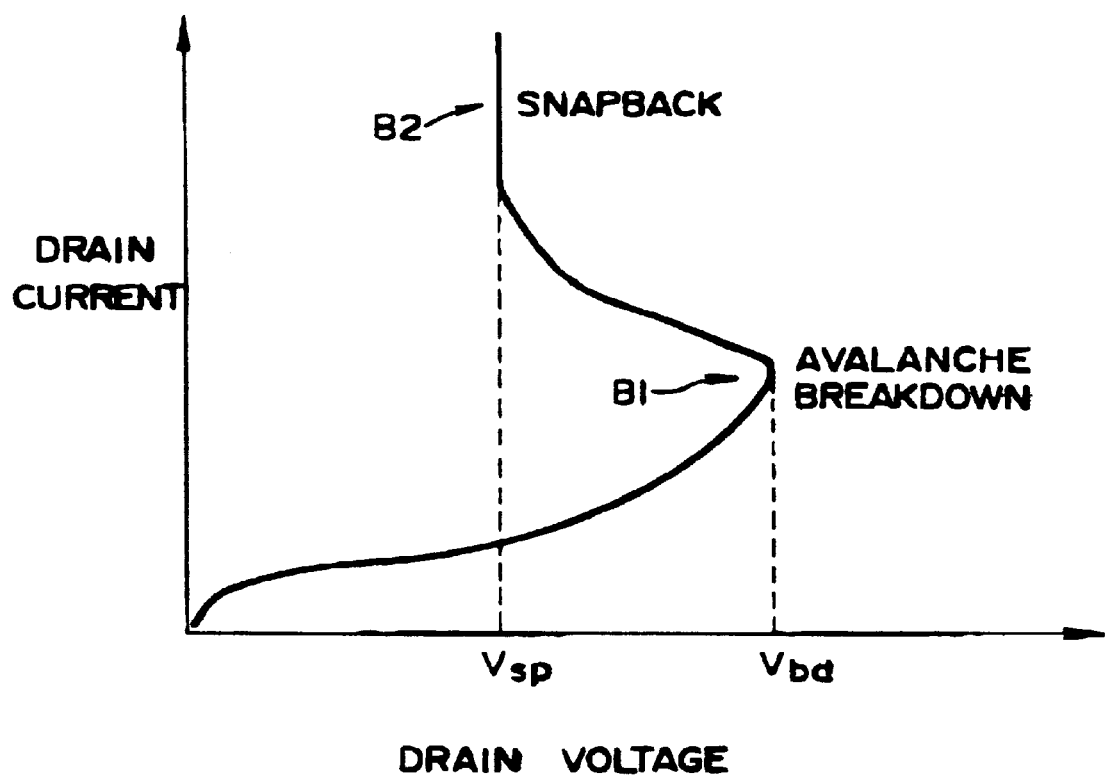
FIG. 6 is a graph illustrating the snapback.

As described in connection with FIG. 3, the diode D3 parasitizing the drain region 4 initiates an avalanche breakdown, when the surge 62 is applied to the drain region 4. At this time, the drain voltage becomes Vbd, as shown by B1 in FIG. 6. When the bipolar BP1 is then turned on, the drain voltage lowers from Vbd to Vsp, as shown by B2 in FIG. 6. Such a phenomenon in which the drain voltage is lowered is called "snapback". On snapback, the input impedance of the drain region 4 is very low. Therefore, charges injected into the drain region 4 by the surge 62 can be easily discharged to the ground potential. For example, even if the applied surge 62 is equal to 200 V, the voltage in the drain region 4 can be reduced to about Vsp=8 V. The protection circuit in FIG. 1A protects the semiconductor device using the snapback.

The thinner of the gate insulating film 11 by the in deep submicron process causes a new problem in that the gate insulating film 11 would be electrostatically broken down even though the snapback was utilized to lower the voltage of the drain region 4 to Vsp=8 V. In other words, the gate insulating film in the protection circuit of FIG. 1A will be electrostatically broken down by the high voltage in the channel region that is brought by the snapback.

According to the present embodiment, the potential in the p-type well 16 (channel region 64) is transmitted to the gate electrode 3 through the n-type diffusion region 1. Therefore, the potential difference between the gate electrode 3 and the channel region 64 can be reduced to protect the gate insulating film 11. This improves the ESD performance as shown in FIG. 5 at A1.

In the normal circuit design, it is preferable that the gate electrode 3 of the output buffer is not connected to the n-type diffusion region 1 which is substantially in floating state. This is because it is considered that the circuit may malfunction in the presence of the n-type diffusion region 1. The main characteristic of the present embodiment is that the n-type diffusion region 1 is electrically connected to the gate electrode 3 in positive opposition to the fact that such a connection may interfere with the desired arrangement of the present embodiment.

Figure 7A:
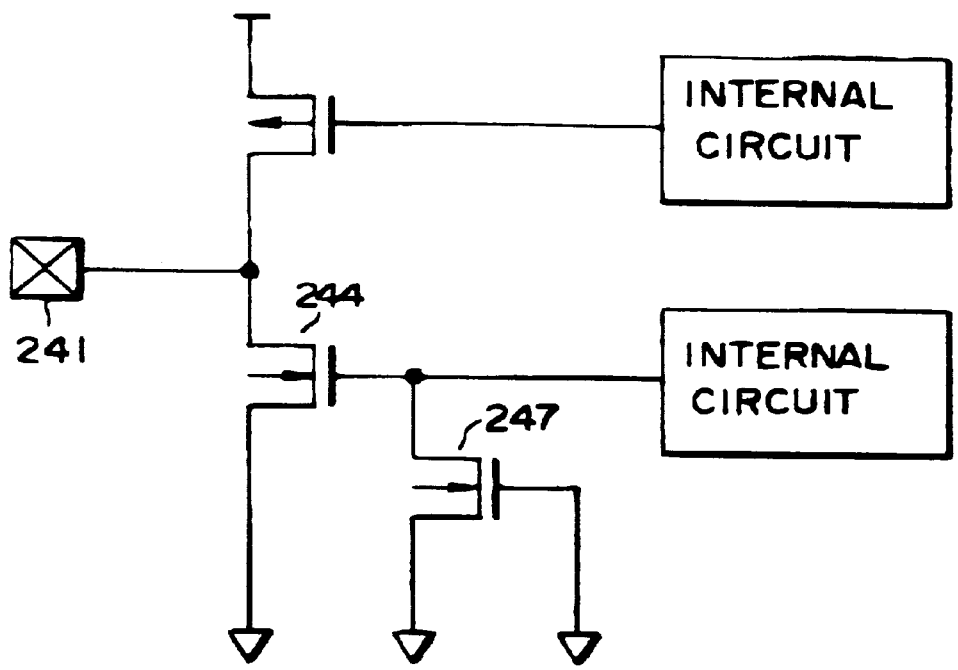
FIGS. 7A and 7B illustrate comparative examples.
Figure 7B:
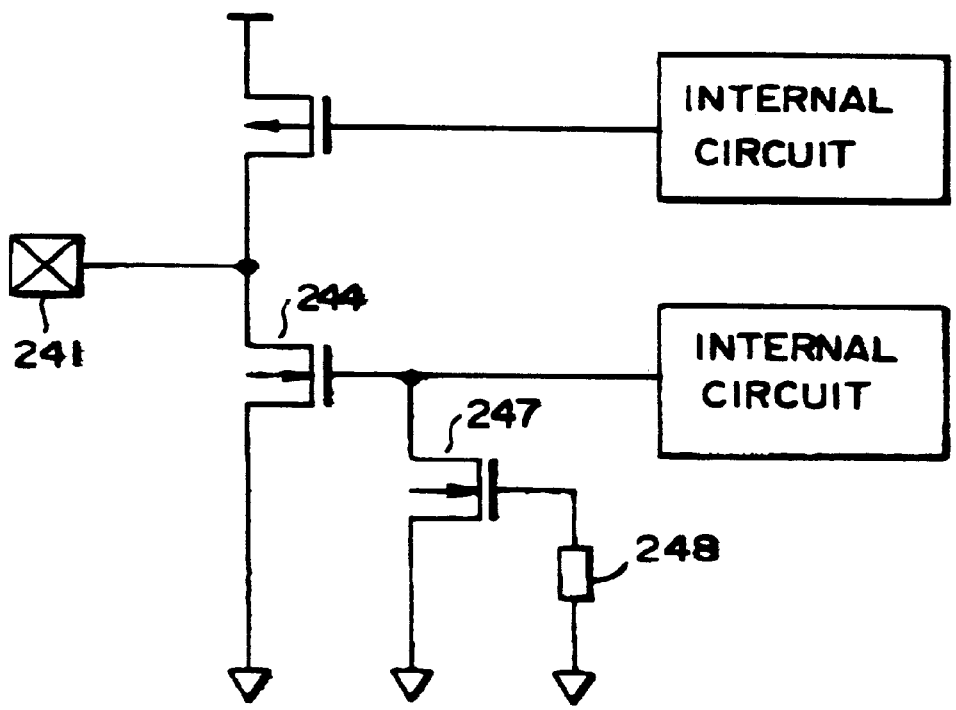

FIGS. 7A and 7B show other forms of a protection circuit for avoiding the electrostatic breakdown in the gate insulating film as comparative examples. In FIG. 7A, the drain region of a normally turned-off transistor 247 is connected to the gate electrode of a transistor 244. In FIG. 7B, a resistor 248 is located to have one end connected to the ground potential and the other end connected to the gate electrode of the transistor 247.

In the arrangement as shown in FIGS. 7A and 7B, the drain region of the transistor 247 provides the function of the n-type diffusion region 1 in the present embodiment. In FIG. 7B, provision of the resistor 248 prevents the gate insulating film of the transistor 247 from being electrostatically ruptured.

However, these comparative examples have the following problems:
(1) The transistor 247 and resistor 248 for protecting the transistor 244 are required. This enlarges the occupied area in the protection circuit and thus the chip area.
(2) The structure of the protection circuit is complicated, resulting in problems such as increase of the parasitic capacity. As a result, the operation of the circuit may be hindered.
(3) As shown in FIG. 8, if a surge 250 is applied from the side of the internal circuit through a roundabout way, a gate insulating film 254 in a transistor 247 which protects the transistor 244 will be electrostatically broken down. In other words, a bipolar BP3 formed by a drain region 256, p-type well 258 and source region 260 are turned on by the surge 250. Thus, a channel region 262 is brought into its high-voltage state, so that the gate insulating film 254 will be electrostatically ruptured.

In such an arrangement of FIG. 7B in which the resistor 248 is connected to the gate electrode of the transistor 247, a problem is raised in that the potential of the gate electrode may be slow to follow a drastic potential change, when the potential in the drain region 256 or channel region 262 changes rapidly.

In the comparative examples of FIGS. 7A and 7B, it is highly possible that the surge 250 takes a roundabout way since the transistor 247 is disposed near the transistor 244 to be protected. Furthermore, the transistor 247 will be subject to the electrostatic damage due to the surge 250 since the size thereof is very smaller than that of the transistor 244.

In contrast, in the present embodiment shown in FIGS. 2A and 2B, the n-type diffusion region 1 is not a element of the transistor. Therefore, the scale of the protection circuit can be extremely reduced according to the present embodiment in comparison with those shown in FIGS. 7A and 7B. Furthermore, the present embodiment does not include the bipolar BP3 or gate insulating film 254 as shown in FIG. 8. Therefore, there is no electrostatic rupture due to the surge 250 applied through a roundabout way from the internal circuit or the like.

5. Layout

Figure 9A:
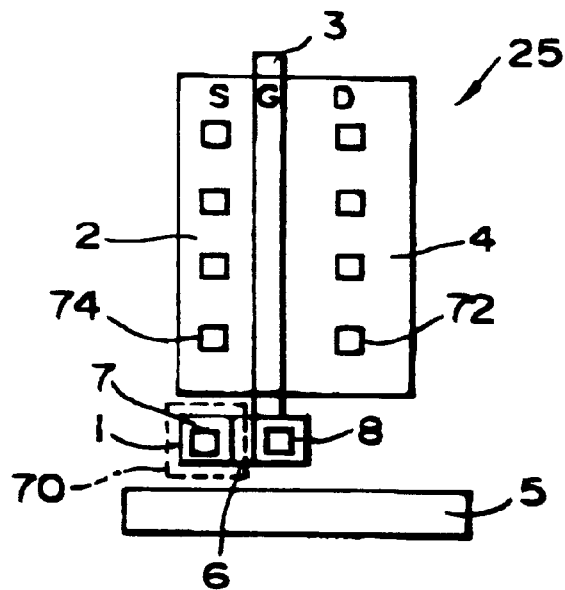
FIG. 9A illustrates a layout according to the present embodiment.

FIG. 9A shows a layout in the protection circuit of the present embodiment. Referring to FIG. 9A, the n-type diffusion region 1 is formed in a region 70 on the side of the source region 2 with respect to the gate electrode 30 between the source region 2 and the p-type diffusion region 5 opposite to the source region 2. This can effectively simplify the layout. It is further advantageous in that the distance between a drain contact 72 and a contact 7 can be longer than the distance between the drain contact 72 and a source contact 74.

In the layout of FIG. 9A, particularly, a contact 8 (second contact) is formed at an extended portion of the gate electrode 3 toward the p-type diffusion region 5. The gate electrode 3 is connected to the metal conductor 6 through this contact 8. The metal conductor 6 is in turn connected to the n-type diffusion region 1 through the contact 7 (first contact). Such a layout requires spaces between the transistor 25 from the p-type diffusion region 5 for forming the contact 8. Therefore, the region 70 becomes an unused space. If the n-type diffusion region 1 and contact 7 are laid out within such an unfilled space, the protection circuit may be reduced in scale to miniaturize the chip area.

Figure 9B:
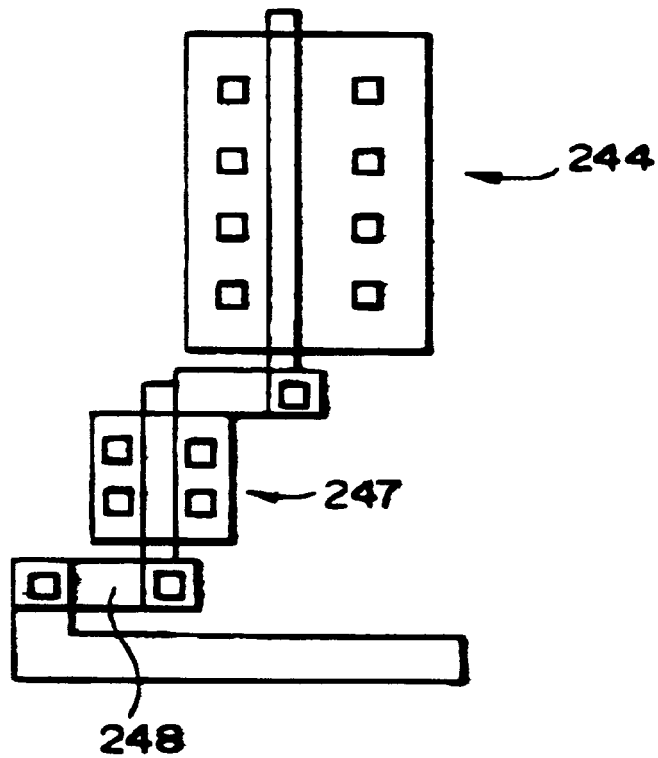
FIG. 9B illustrates another layout according to the present embodiment.

On the other hand, the protection circuit according to the comparative examples shown in FIGS. 7A and 7B requires the layout of the transistor 247 and resistor 248, as shown in FIG. 9B. Therefore, the protection circuit is increased in scale and enlarges the chip area, unlike the layout of FIG. 9A.

Figure 10A:
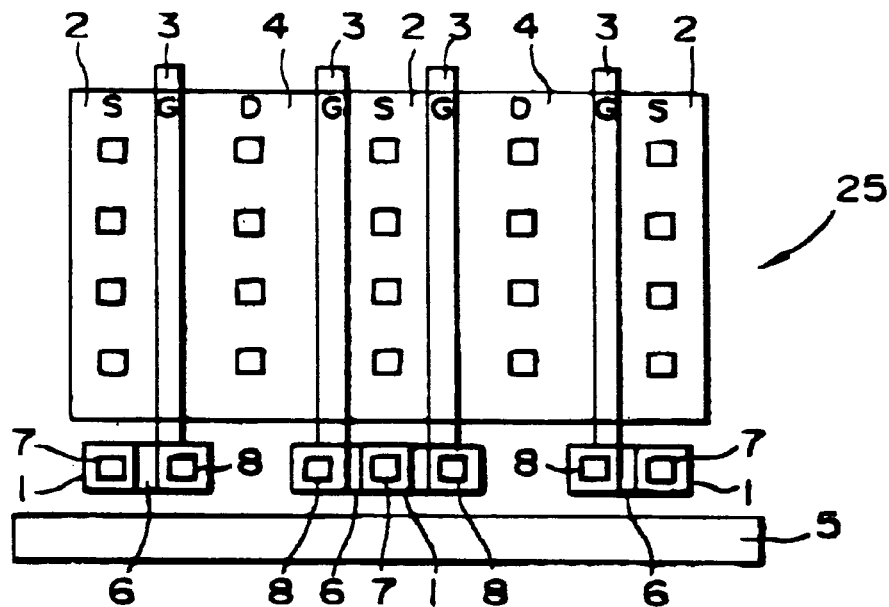
FIGS. 10A and 10B illustrate other layouts according to the present embodiment.

FIG. 10A shows still another layout according to the present embodiment, in which a single drain region 4 is shared by two source regions 2. In such a layout, the n-type diffusion region 1 and contact 7 can be effectively laid out within a unfilled space.

Figure 10B:
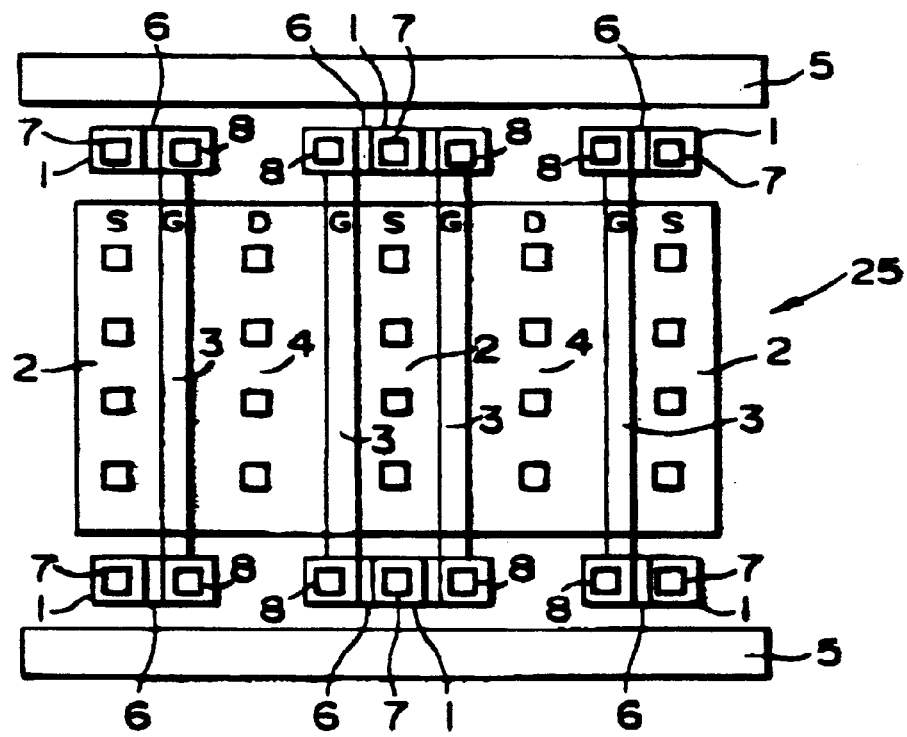

On the other hand, FIG. 10B shows a further layout in which the n-type diffusion region 1 and contact 7 are laid out in the transistor 25 on the opposite sides thereof, respectively. In such a layout, the potential of the p-type well (channel region) can be effectively transmitted to the gate electrode 3 of the transistor 25 so that the potential difference between the gate electrode and the channel region can be rapidly reduced.

6. Prevention of Current-Flow to N-Type Diffusion Region

As can be seen from FIG. 3, a high current flows into the n-type diffusion region 1, when the diode D3 causes an avalanche breakdown and the bipolar BP2 is turned on. This may cause an electrostatic rupture to the n-type diffusion region 1 or contact 7.

Then, the present embodiment provides the following measure for avoiding such a flow of high current.

Figure 11A:
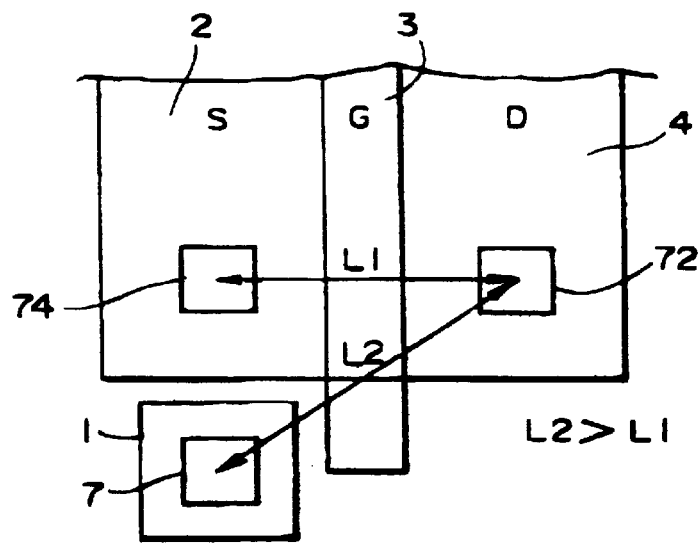
FIGS. 11A and 11B illustrate the relationship among the source contact, the drain contact, an n-type diffusion region and a contact formed in the n-type diffusion region.
Figure 11B:
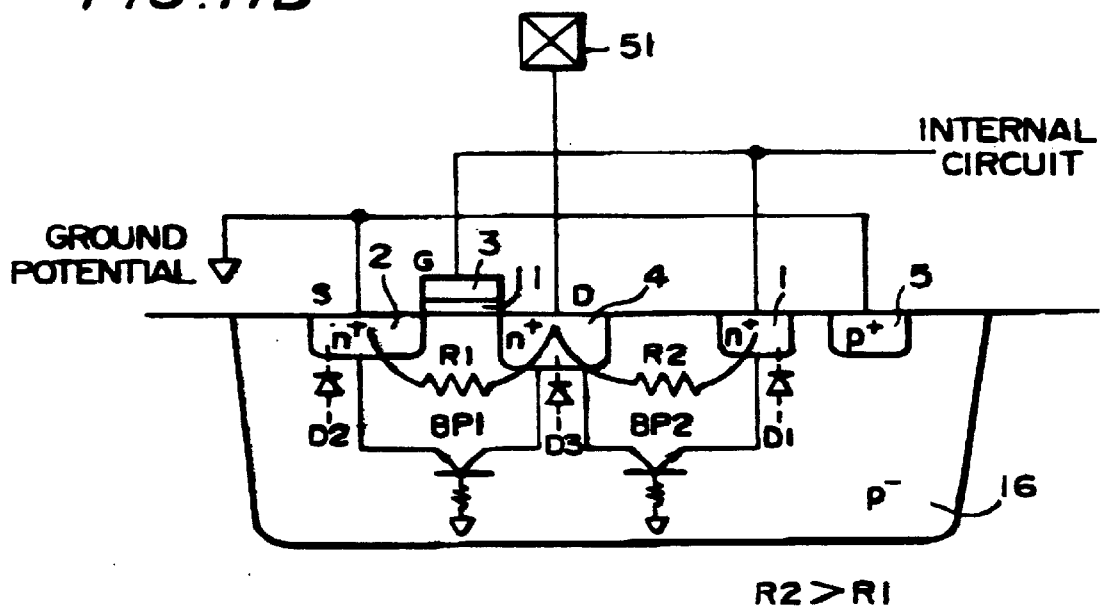

As shown in FIG. 11A, for example, it is assumed that the distance between the drain contact 72 and the source contact 74 is L1. The distance between the drain contact 72 and the contact 7 of the n-type diffusion region 1 is L2. The present embodiment defines a rule of design such that L2 is always larger than L1. This can prevent a high current from flowing into the n-type diffusion region 1 when the bipolar BP2 is turned on as shown in FIG. 11B. Thus, the n-type diffusion region 1 and contact 7 can be prevented from being electrostatically broken down.

Although FIG. 11A shows such a layout that the n-type diffusion region 1 is disposed on the side of the source region 2, any other layout may be used in the present invention as long as the relationship of L2>L1 is maintained.

Furthermore, the layout of n-type diffusion region 1 and others may be determined based on the relationship between a resistance R1 of a parasitic resistor between the drain contact 72 and the source contact 74 and a resistance R2 of a parasitic resistor between the drain contact 72 and the contact 7. In such a case, the n-type diffusion region 1 and others are laid out such that the relationship of R2>R1 can be maintained. This can prevent the n-type diffusion region 1 and contact 7 from being electrostatically ruptured.

In addition, the n-type diffusion region 1 and others may be laid out considering any factors other than the distances L1, L2, and parasitic resistance R1, R2. More particularly, the layout of the n-type diffusion region 1, source region 2, drain region 4, p-type diffusion region 5 and others is determined such that on application of a surge or the like, the bipolar BP1 will be turned on while the bipolar BP2 will not be turned on. To this end, for example, a measure of making the distance between the p-type diffusion region 5 and the n-type diffusion region 1 smaller than the distance between the p-type diffusion region 5 and the source region 2 may be effective, in addition to L2>L1 and R2>R1.

7. Size of N-Type Diffusion Region and Contact

By keeping the high current from flowing into the n-type diffusion region 1 as described, the n-type diffusion region 1 and contact can be reduced to minimum size according to the rule of design. More particularly, as shown in FIG. 12A, the size D1 of the contact 7 and the overlap allowance D2 of the n-type diffusion region 1 on the contact 7 can be made minimum.

As will be apparent from FIGS. 9A, 10A and 10B, thus, the layout area of the protection circuit can be reduced. In other words, there is provided a protection circuit having its high ESD performance with a reduced area of circuitry.

8. Salicide Process

Recently, the parasitic resistance in the impurity area and gate electrode has been increasing with more refinement of the semiconductor device in component dimension. Such an increase of parasitic resistance leads to reduction of the operational speed in the circuit. There has been proposed a salicide process as a technique of reducing the parasitic resistance in the diffusion region or gate electrode.

The salicide process involves spattering and heat-treatment of a metal film such as titanium, cobalt, tungsten, molybdenum, tantalum or the like over the whole surface of a silicon substrate on which diffusion regions and gate electrodes are to be formed. Thus, the silicon in the diffusion region or gate electrode is mixed with the deposited metal to form an alloy or silicide film. Thereafter, any non-alloyed metal residue is removed from the substrate. In such a manner, the silicide film will be formed in self-alignment relative to the gate electrode or diffusion region. As a result, the parasitic resistance in the gate electrode or diffusion region can be widely reduced to speed up the circuit.

However, there is a problem in that a transistor formed according to the salicide process has its ESD performance lower than that of a transistor formed according to any process other than the salicide process. This is because the electrostatical discharged current tends to concentrate in the end of the gate electrode by the reduced parasitic resistance in the salicided transistor at its diffusion region.

In the present embodiment, the ESD performance is improved by forming the transistor of the internal circuit into a salicided structure without forming the transistor in the protection circuit into a salicided structure. However, the contact region includes a salicide film formed therein even in the protection circuit. This is because when the metal conductor is contacted directly to the diffusion region in the contact region, an ohmic connection cannot be made.

In FIG. 9A, for example, the metal conductor may be connected to the drain region 4 or source region 2 through the silicide film in the drain region 72 or source contact region 74.

Also in the region of the contact 7, the metal conductor 6 may be connected to the n-type diffusion region 1 through the silicide film 80, as shown in FIG. 12B.

In such a case, the silicide film 80 is formed without overlapping the device isolation film 26 surrounding the n-type diffusion region 1. If the silicide film 80 overlaps the device isolation film 26 as shown by E1 or E2 in FIG. 12B, the electrostatic discharge may be concentrated in the overlapping area to rupture it.

To reduce the layout area of the protection circuit, it is desirable that the size D1 of the contact 7, the overlap allowance D3 of the silicide film relative to the contact 7 and the overlap allowance D4 of the n-type diffusion region 1 relative to the silicide film 80 are set minimum according to the rule of design.

9. Supply Potential of Signal Applied to Gate Electrode

As shown in FIG. 13A, the protection circuit of the present embodiment raises a problem. When the supply potential of a signal applied to the gate electrode 3 is different from the supply potential applied to the p-type well 16, the diode D1 is turned on to create a leakage of current. For example, if the low-side supply potential of a signal applied to the gate electrode 3 is equal to −5 V (or the supply potential in a pre-stage transistor 92 being equal to −5 V) and if the supply potential provided to the p-type well 16 being equal to −3 V, the potential in the p-type well 16 will be higher than that of the n-type diffusion region 1 by about 2 V. This turns the diode D1 on.

In such a case, the supply potential of the signal applied to the gate electrode 3 and the n-type diffusion region 1 is set to be equal to a supply potential given to the p-type diffusion region 5. More particularly, as shown in FIG. 13B, the pre-stage of the transistor 25 having a supply potential equal to −3 V includes a transistor 90 (buffer) having a supply potential equal to −3 V. Further, the pre-stage of the transistor 90 is provided with a transistor 92 having a supply potential equal to −5 V. Thus, it is possible to prevent the diode D1 from turning on to create a leakage of current.

It is assumed that the supply potential of a signal applied to the gate electrode and the n-type diffusion region 1 is V1, and the supply potential applied to the p-type diffusion region 5 is V2. V1 and V2 may be set to any potential as long as the diode D1 formed by n-type diffusion region 1 and the p-type well 16 are not turned on. For example, V1 does not have to be equal to V2; V1 may be larger than V2. Moreover, when 25 is the p-type transistor, V1 may be smaller than V2.

10. Modified Forms of Protection Circuit

The present embodiment may be applied in any of various modified forms.

Figure 14A:
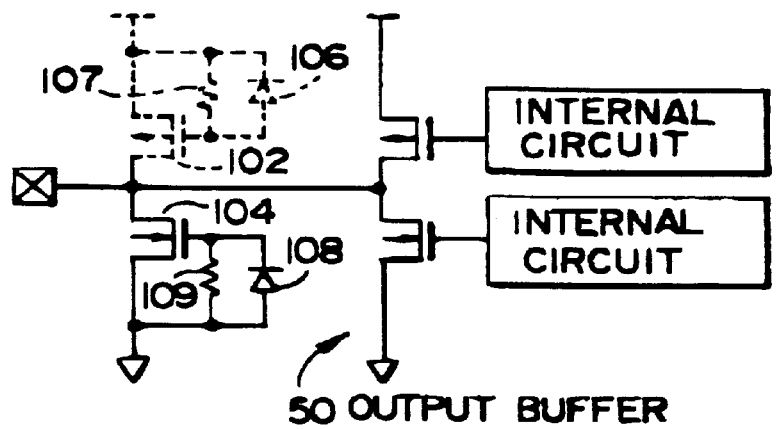
FIGS. 14A, 14B and 14C illustrate various modifications of the protection circuit according to the present embodiment.

As shown in FIG. 4A, the output buffer 50 itself functions as a protection circuit. As shown in FIG. 14A, however, an n-type transistor 104 and diode 108 may be provided to form such a protection circuit as in the present embodiment apart from an output buffer.

In such a case, a p-type transistor 102 and diode 106 may be provided to form such a protection circuit as in the present embodiment.

Figure 14B:
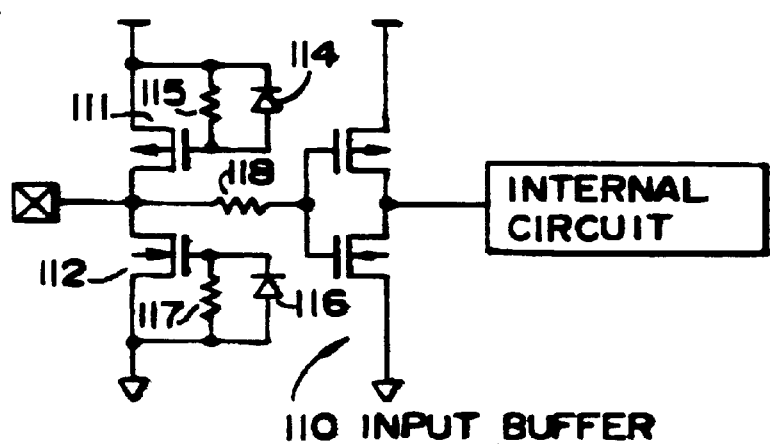

The present embodiment may be applied to such a protection circuit for an input buffer 110 as shown in FIG. 14B. In such a case, it is desirable that transistors 111, 112 and didoes 114, 116 are provided at the pre-stage of a resistor 118 connected to the gate electrode of the input buffer 110 to form such a protection circuit as in the present embodiment. Such an arrangement can effectively prevent the gate electrode of the input buffer 110 from ESD damage.

Figure 14C:
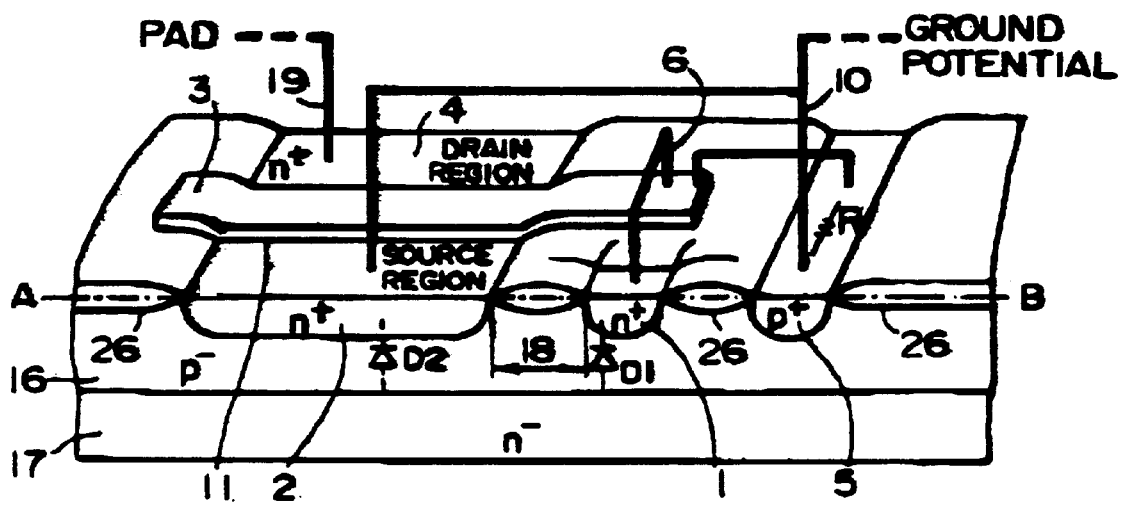

As shown in FIGS. 14A and 14B, it is desirable that resistors (elements) 107, 109, 115 and 117 are provided parallel with diodes 106, 108, 114 and 116, so that transistors 102, 104, 111 and 112 are turned off completely. In this case, as shown in FIG. 14C, it would be preferable to make use of the resistance of the p-type diffusion region 5 (the first diffusion region) to form the resistors 107, 109, 115 and 117. In this way, it is possible to prevent the enlargement of a protection circuit.

Figure 15A:
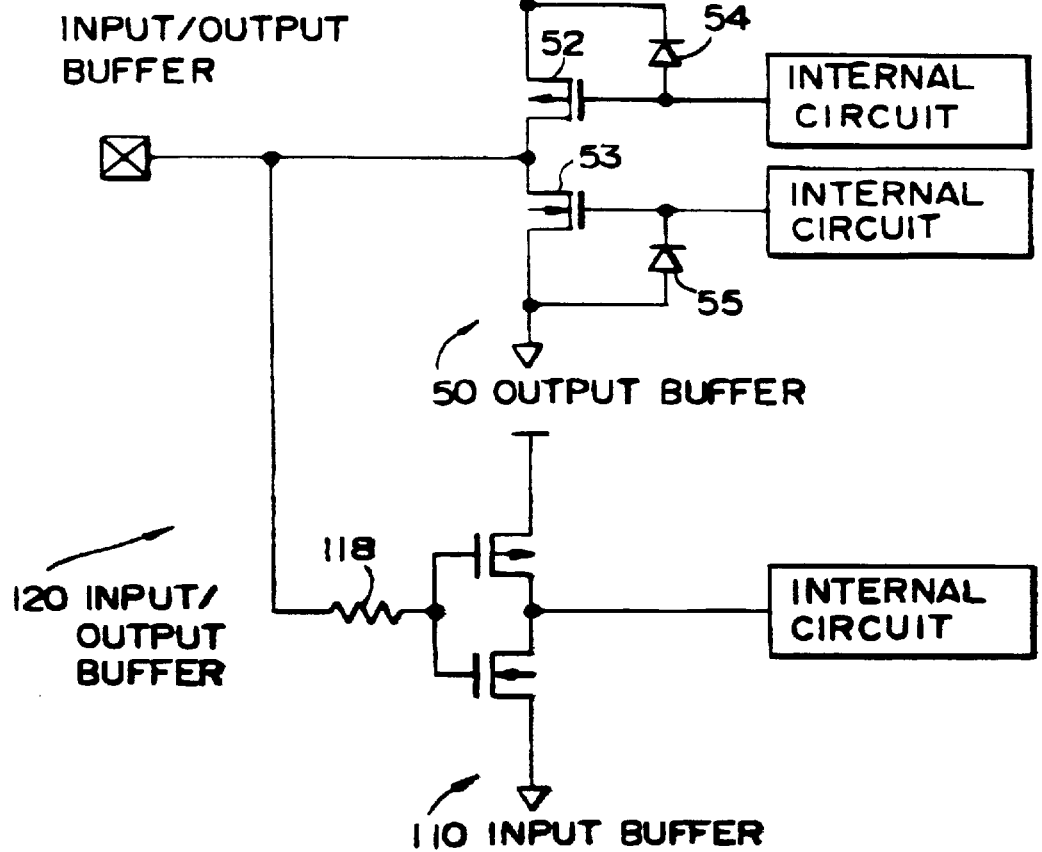
FIGS. 15A and 15B illustrate various modifications of the protection circuit according to the present embodiment.

As shown in FIG. 15A, furthermore, the present embodiment may be applied to an input/output buffer 120 that is formed by the output buffer 50 and the input buffer 110. In such a case, transistors 52, 53 and didoes 54, 55 in the output buffer 50 function as a protection circuit. As in the FIG. 14B, however, the pre-stage of a resistor 118 may be provided with transistors and diodes that form such a protection circuit as in the present embodiment.

Figure 15B:
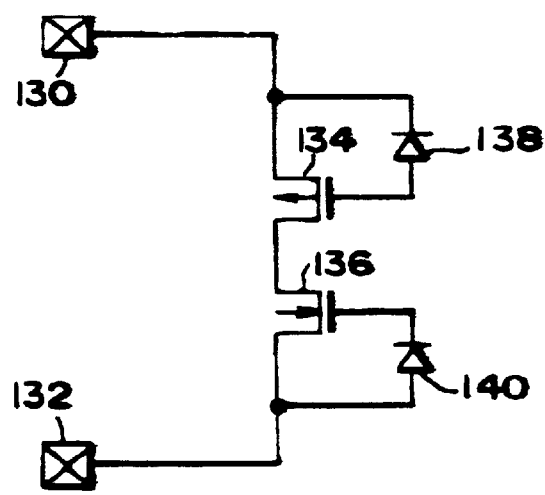

As shown in FIG. 15B, furthermore, the present embodiment may be applied to a protection circuit which is provided between power-supply pads 130 and 132. In such a case, transistors 134, 136 and diodes 138, 140 are provided between the power-supply pads 130 and 132 to form such a protection circuit as in the present embodiment. By providing such a protection circuit, the internal circuit and others may be prevented from ESD damage, when a surge is applied to between the power-supply pads 130 and 132 or if a surge is applied to the internal circuit or the like from the other pad through a roundabout way.

Figure 16A:
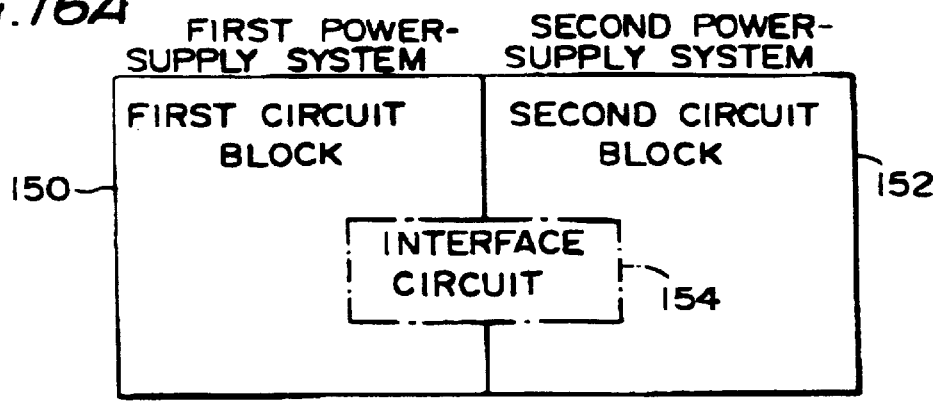
FIGS. 16A and 16B illustrate various modifications of the protection circuit according to the present embodiment.
Figure 16B:
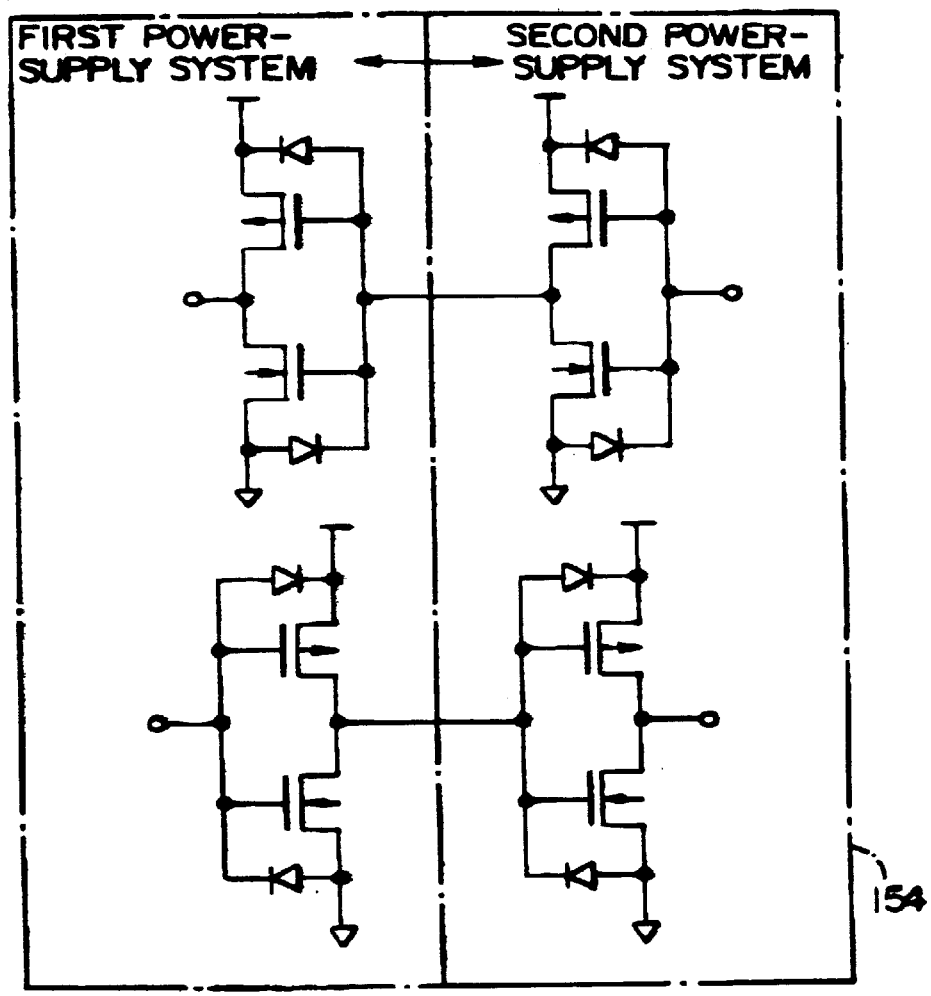

The protection circuit of the present embodiment is not limited to connection with the pad. As shown in FIGS. 16A and 16B, for example, the protection circuit according to the present embodiment may be applied to an interface circuit 154 between a first circuit block operable in a first power-supply system and a second circuit block 152 operable in a second power-supply system. By providing such a protection circuit, it is possible to avoid the circuit of the second circuit block 152 being ruptured by a surge from the first power-supply system or the circuit of the first circuit block 150 being broken down by a surge from the second power-supply system.

A semiconductor device having the circuit blocks operable in such different power-supply systems may be a semiconductor device for driving a liquid-crystal which has a circuit block operable in a power-supply system for a liquid crystal and another circuit block operable in a power-supply system for a control circuit. Furthermore, an analog and digital semiconductor device having a circuit block operable in power-supply system for an analog circuit and another circuit block operable in a power-supply system for a digital circuit may be considered.

The present invention is not limited to the aforementioned forms, but may be carried out in any of various other forms without departing from the spirit and scope of the invention.

It is desirable that the layout of the protection circuit according to the present invention is the ones shown in FIGS. 9A, 10A and 10B. Nevertheless, the present invention is not limited to such a structure, but may be applied to any of various other forms.

Furthermore, though it is particularly desirable that the relationship among the source contact, the drain contact, the second diffusion region and the contact formed in the second diffusion region is as described in connection with FIGS. 11A and 11b, the present invention is not limited to such a structure.

Although it is particularly desirable that a single contact for electrically connecting the gate electrode and the second diffusion region is made minimum in size as shown in FIG. 12A, the present invention is not limited to such a layout. For example, there may be provided two or more contacts each of which is slightly larger than the minimum size.

The protection circuit according to the present invention may be applied in any of various forms other than those of FIGS. 14A–16B.

What is claimed is:

1. A semiconductor device protection circuit for protecting a semiconductor device from a surge applied to a drain region, comprising:

a second-conductive type transistor being formed in a first-conductive type first region and having a gate electrode, said drain region and a source region to which a supply potential is applied;

a first-conductive type first diffusion region at least partially overlapping said first-conductive type first region and to which said supply potential is applied; and a second-conductive type second diffusion region being formed in said first-conductive type first region and being a non-element of a transistor, wherein said gate electrode of said second-conductive type transistor being electrically connected to said second diffusion region, and further, wherein said second diffusion region is on the side of said source region with respect to said gate electrode and is surrounded by said source region, said gate electrode and said first diffusion region adjacent said source region.

2. The semiconductor device protection circuit according to claim 1, further comprising:

a second contact formed at an extended portion of said gate electrode extending toward said first diffusion region;

a metal conductor connected to said gate electrode through said second contact; and a first contact connected between said metal conductor and said second diffusion region.

3. The semiconductor device protection circuit according to claim 1, wherein the distance L1 between a drain contact formed in said drain region and a source contact formed in said source region is shorter than the distance L2 between said drain region and a first contact formed in said second diffusion region.

4. The semiconductor device protection circuit according to claim 1, wherein a resistance R1 of a parasitic resistor between a drain contact formed in said drain region and a source contact formed in said source region is lower than a resistance R2 of a parasitic resistor between said drain contact and a first contact formed in said second diffusion region.

5. The semiconductor device protection circuit according to claim 1, wherein said drain region, said source region, said first diffusion region and said second diffusion region are laid out so that a first bipolar formed by said drain region, said first region and said source region is turned on and a second bipolar formed by said drain region, said first region and said second diffusion region remains off when protecting the semiconductor device.

6. The semiconductor device protection circuit according to claim 1, wherein a single first contact of minimum size for electrically connecting said gate electrode to said second diffusion region is formed in said second diffusion region.

7. The semiconductor device protection circuit according to claim 1, wherein a silicide film is formed in said second diffusion region without overlapping a device isolation film surrounding said second diffusion region and wherein said silicide film includes a first contact formed therein for electrically connecting said gate electrode to said silicide film.

8. The semiconductor device protection circuit according to claim 1, wherein a supply potential of a signal applied to said gate electrode and second diffusion region and the supply potential applied to said first diffusion region is set to potentials which prevent a diode formed by said second diffusion region and first region from turning on.

9. The semiconductor device protection circuit according to claim 8, wherein the supply potential of the signal applied to said gate electrode and second diffusion region is equal to the supply potential applied to said first diffusion region.

10. The semiconductor device protection circuit according to claim 1, wherein a connection of at least one output buffer, input buffer and input/output buffer with a pad includes the semiconductor device protection circuit.

11. The semiconductor device protection circuit according to claim 1, wherein a connection of an interface circuit between a first circuit block operable in a first power-supply system and a second circuit block operable in a second power-supply system different from the first power-supply system includes the semiconductor device protection circuit.

* * * * *